US008744379B1

(12) United States Patent
Sung

(10) Patent No.: US 8,744,379 B1
(45) Date of Patent: Jun. 3, 2014

(54) TEMPERATURE INDEPENDENT CMOS RADIO FREQUENCY POWER DETECTOR

(71) Applicant: Futurewei Technologies, Inc., Plano, TX (US)

(72) Inventor: Eric Sung, Greensboro, NC (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 13/731,815

(22) Filed: Dec. 31, 2012

(51) Int. Cl.
*H03C 1/62* (2006.01)
*H04B 17/00* (2006.01)

(52) U.S. Cl.
USPC .................................. 455/115.1; 455/67.11

(58) Field of Classification Search
USPC .................... 455/67.11, 69, 115.1, 115.3, 522
See application file for complete search history.

(56) References Cited

U.S. PATENT DOCUMENTS

| 7,212,592 B2 * | 5/2007 | Drapkin et ..................... 375/345 |
| 7,659,707 B2 * | 2/2010 | Eken et al. ................. 324/76.11 |
| 7,697,909 B2 * | 4/2010 | Kouwenhoven ........... 455/226.1 |
| 7,791,400 B2 * | 9/2010 | Li ................................. 327/349 |
| 8,422,970 B1 * | 4/2013 | Van Staveren et al. ....... 455/130 |

OTHER PUBLICATIONS

Zhou, Yijun, et al., "A Low-Power Ultra-Wideband CMOS True RMS Power Detector," IEEE Transactions on Microwave Theory and Techniques, vol. 56, No. 5, May 2008, 7 pages.

* cited by examiner

*Primary Examiner* — Quochien B Vuong
(74) *Attorney, Agent, or Firm* — Conley Rose, P.C.; Grant Rodolph; Nicholas K. Beaulieu

(57) ABSTRACT

A power detector circuit, comprising a first section configured to receive a radio frequency (RF) input signal and to generate a first voltage, wherein the first voltage comprises a voltage proportional to the sum of a mean-square of the RF input signal and a voltage characteristic of the first section, and wherein the first voltage is an input to a third section, a second section configured to generate a second voltage, wherein the second voltage comprises a combination of an output voltage and a voltage proportional to the voltage characteristic of the first section, wherein the output voltage is proportional to a root-mean-square of the RF input signal, the third section configured to generate the output voltage by combining the first voltage and the second voltage, wherein the second section creates a negative feedback loop for the third section and the output voltage generated by the third section is an output of the power detector circuit.

20 Claims, 4 Drawing Sheets

TEMPERATURE INDEPENDENT CMOS RADIO FREQUENCY POWER DETECTOR

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

The present disclosure concerns radio frequency (RF) power detectors in general, and more specifically complementary metal-oxide-semiconductor (CMOS) RF power detectors. RF power detectors may be used in wireless RF communication systems to monitor the output power of a RF transmitter and/or the input power of a RF receiver. The RF detector may produce a voltage signal indicative of a power of an RF signal. It may be desired for an RF power detector to produce consistent voltages for the same measured RF power regardless of the operating temperature. Restated, it may be desired for an output of the RF power detector to be independent of temperature.

The output of a conventional RF power detector may tend to change due to changes in temperature. And, since most modern communication systems are hand-held and/or operated in extreme environments, high temperature operating conditions are frequently encountered. Current solutions to this problem may involve testing the RF power detector at multiple temperatures to obtain offset coefficients relating to that RF power detector. These offset coefficients may be loaded into a device using that power detector for use during operation of the RF power detector. The offset coefficients may be used by the device to correct measured RF powers at varying temperatures. However, this solution may require extensive testing of RF power detectors after they are manufactured plus the added tasks of calculating the offset coefficients and storing them so they are associated with the proper RF power detector.

SUMMARY

In one embodiment, the disclosure includes a power detector circuit, comprising a first section configured to receive a radio frequency (RF) input signal and to generate a first voltage, wherein the first voltage comprises a voltage proportional to the sum of a mean-square of the RF input signal and a voltage characteristic of the first section, and wherein the first voltage is an input to a third section, a second section configured to generate a second voltage, wherein the second voltage comprises a combination of an output voltage and a voltage proportional to the voltage characteristic of the first section, wherein the output voltage is proportional to a root-mean-square of the RF input signal, the third section configured to generate the output voltage by combining the first voltage and the second voltage, wherein the second section creates a negative feedback loop for the third section and the output voltage generated by the third section is an output of the power detector circuit.

In another embodiment, the disclosure includes a RF power detector comprising a first circuit configured to receive an input RF signal and to generate a DC voltage proportional to a mean-square of the input RF signal and a voltage characteristic of the operation of the first circuit at an output of the first circuit, a second circuit configured to generate an output voltage and a voltage equal to the first voltage at an output of the second circuit, and a first operational amplifier having a first input coupled to the output of the first circuit, a second input coupled to the output of the second circuit, and an output of the first operational amplifier coupled to the second circuit through a transconductor, wherein the output of the first operational amplifier is proportional to the output voltage, which is a root-mean-square of the input RF signal.

In yet another embodiment, the disclosure includes a method for producing an output voltage of an RF power detector comprising receiving, by a first circuit, an RF input signal, generating, by the first circuit, a first voltage comprising a DC voltage proportional to a mean-square of the RF input signal and a temperature dependent voltage characteristic of the first circuit, generating, by a second circuit, a second voltage comprising an output voltage plus a voltage equal to the first voltage, combining, by a operational amplifier, the first voltage and the second voltage, and generating, by the operational amplifier, the output voltage, wherein the output voltage is temperature independent and is a root-mean-square of the RF input signal.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that, although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

With the growth of wireless RF communication systems, there has been an explosion in the number of handheld devices and base stations across the globe. With this growth in communication electronics comes an increase in the power consumption of both the base stations and the handheld devices. With no reduction in the use or expansion of wireless technology in any facet of our world, a reduction in the power consumption may need to be addressed. The power consumption in the wireless industry may need to be addressed to reduce operation costs, reduce overall consumption and to potentially address a growing concern for the interaction of RF wireless energy and human physiology.

Figure 1:
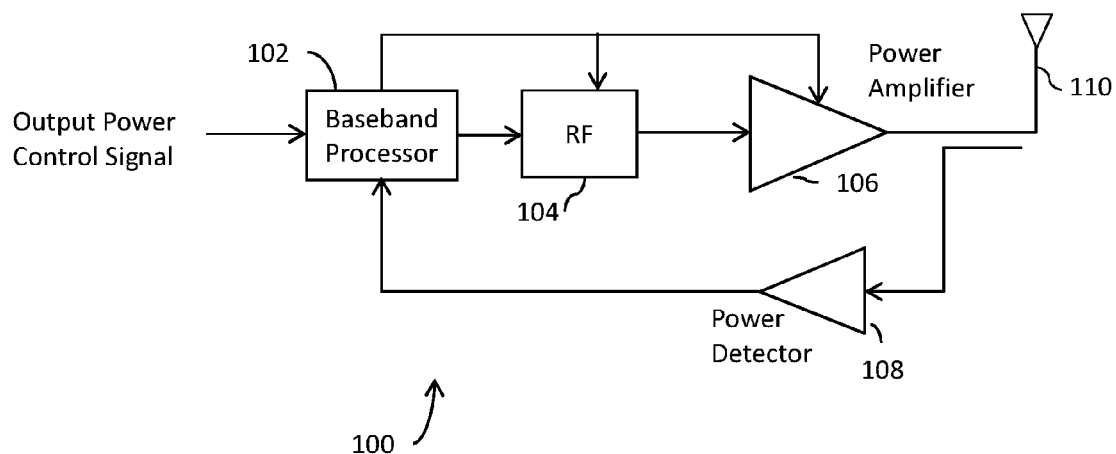
FIG. 1 illustrates an embodiment of a RF transmitter using a RF power detector.

FIG. 1 illustrates an embodiment of a wireless RF communication system 100. The wireless communication system 100 comprises baseband processor 102, RF module 104, power amplifier 106, power detector 108, and antenna 110 as configured in FIG. 1. The wireless communication system 100 may be used to transmit RF signals. For example, the wireless communication system 100 may be used to transmit RF signals from a base station to a handheld device or from the handheld device to the base station. The baseband processor 102 may produce or introduce a data signal to the RF module 104. The RF module 104 may then step up the frequency of the data signal to a frequency designated for transmission and output the RF signal to the power amplifier 106. The RF module 104 may also have an associated gain that may be controlled by baseband processor 102. The power amplifier 106 may amplify the RF signal received from RF module 104 for transmission to or from a base station. The power amplifier 106 may also have an associated gain that may be varied by baseband processor 102. The power detector 108 may be used to measure the RF power of a signal transmitted by the power amplifier 106. A directional coupler (not shown) may be used to couple the transmitted signal to the power detector 108.

The baseband processor 102 may receive a signal to alter the power of the transmitted signal from base stations or handheld devices receiving its transmissions. If wireless communication system 100 is being implemented in a handheld device, then the base station may inform the handheld device to alter the power of the transmitted signal. If the wireless communication system 100 is being implemented in a base station, then a handheld device may inform the base station to alter the power of the transmitted signal. As discussed above, the management of the transmitted power may be critical in terms of cost savings and possibly in terms of safety. Additionally, the Federal Communication Commission may have guidelines on maximum allowable output power for both base stations and handheld devices. A base station may instruct a handheld device to alter its transmitted power when either the handheld device is transmitting too much power or too little power. If too much power is being transmitted, power may be wasted, instruments may be damaged, and an unsafe situation may be created for users of the devices. If too little power is being transmitted, then dropped signals and high noise may be experienced by the device users. The same analysis may be applied when the base station is implementing the wireless communication system 100.

In order for baseband processor 102 to alter the amount of transmitted power, it may need to know the amount of power actually being transmitted. Due to potential impedance mismatches in wireless communication system 100 between RF generators and antennas, for example, the actual output power may not equal the intended output power. Thus, baseband processor 102 may need to adjust the gain of either RF module 104 or power amplifier 106 and possibly both. To assist with adjusting the transmitted power of wireless communication system 100, power detector 108 measures an RF power being transmitted by the power amplifier 106 to an antenna. The power detector 108 then communicates the measured output power to the baseband processor 102.

The power detector 108 may be designed to detect power in different ways. One method may detect peak power, which may measure the amount of power delivered by a waveform during an interval taken at the peak amplitude of the waveform. Alternately, a power detector may measure the RMS value of a transmitted waveform, or RF signal. When measuring the RMS of the RF signal, the measured value may be proportional to the average power of the RF signal. Additionally, using a detector that measures RMS power, the detector may be less affected by the frequency of the signal being measured and the peak-to-average power of the signal. The peak-to-average power may be denoted as the crest factor. On the other hand, peak power detectors may not accurately measure the power level of RF signals with large crest factors.

Figure 2:
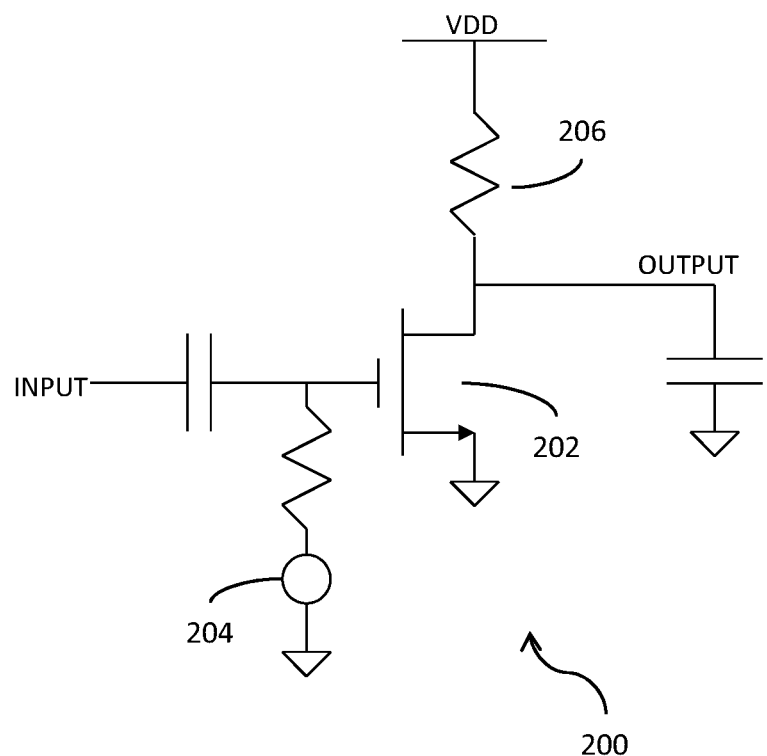
FIG. 2 is a circuit diagram of an embodiment of a conventional RF root-mean-square (RMS) power detector.

FIG. 2 is a circuit diagram of a conventional single-transistor RMS power detector 200. The RMS power detector 200 may be utilized in wireless communication systems similar to wireless communication system 100 and may represent a conventional embodiment of an RMS power detector. The RMS power detector 200 may comprise a transistor 202, a bias voltage source 204, a load resistor 206, and two capacitors. The two capacitors may be implemented such that one couples the gate of transistor 202 to an input and the other couples the drain of transistor 202 to a ground. The capacitor on the input may be used to filter out any unwanted low frequency noise. The capacitor coupling the drain to the ground may create a filter in combination with the load resistor that filters out all but very low frequency signals. The output of the RMS power detector 200 is taken from the drain. The output may be a voltage that is proportional to the RMS value of an input RF signal.

The transistor 202 of RMS power detector 200 may be biased to operate in the saturation region of the transistor characteristics. The transistor 202 in FIG. 2 represents a N-channel metal-oxide-semiconductor (NMOS) structure, but the RMS power detector 200 may also be implemented using P-channel metal-oxide-semiconductor (PMOS), bi-polar, or bi-CMOS technology. When transistor 202 is operating in the saturation region, the output voltage may be a function of $V_{DD}$, a drain current ($I_D$), and the load resistor 206. $V_{DD}$ is a DC biasing voltage connected to transistor 202's drain through the load resistor 206 and may be a circuit voltage used by a wireless communication system similar to wireless communication system 100. $I_D$ is the current running through the transistor 202's drain and may be a function of the gate voltage, the threshold voltage, and $V_{DD}$. Since the transistor 202 may receive a RF input signal, the gate voltage may include a component of an RF input signal. In general, $I_D$ may be affected by a drain-to-source voltage ($V_{ds}$), but the source of the transistor 202 is connected to ground in RMS power detector 200, which may make the source voltage zero. If the source voltage is zero, then $V_{ds}$ may be equal to a voltage at the drain of the transistor 202, $V_{DD}$, or a voltage drop generated by $I_D$ times the load resistor 206 subtracted from $V_{DD}$.

Additionally, CMOS transistors operating in the saturation region typically display a square-law relationship between $I_D$ and a gate-to-source voltage ($V_{GS}$). The transistor's square-law relationship may then be used to solve for an output voltage. For RMS power detector 200, the output voltage may be taken from the drain of transistor 202. In terms of RMS power detector 200, assuming an RF input signal being sinusoidal and of the form A sin(ωt), where A is the amplitude of the signal and ω is the signal's angular frequency, the output can then be defined as:

$$\text{OUTPUT} = V_{DD} - [K^*(A^2/2) + K^*(V_b - V_T)^2]R_L \quad (1)$$

In equation 1, K may be defined as $(0.5)^*\mu^*C_{ox}^*(W/L)$, where μ may be the carrier mobility, $C_{ox}$ may be the charge on the transistor's gate oxide capacitance, W may be the width of the transistor's 202 channel, and L may be the length of the transistor's 202 channel.

Equation 1 may then be used to determine the RMS power of the input RF signal. RMS power detector 200 is designed so that the output voltage is proportional to the RMS power of the RF input signal. Thus, since all parameters in equation 1 are known quantities, output may be solved for, and may equal $A/\sqrt{2}$ for the given RF input. However, the output value obtained will change with temperature for a given RF input signal since $\mu$ is temperature dependent. The threshold voltage $V_T$ is also temperature dependent but has a much smaller effect on the output voltage than does the carrier mobility.

The carrier mobility, $\mu$, may a function of the semiconductor crystal lattice and may be a measure of how the carrier, whether electron or hole, moves, or drifts, through the semiconductor when an electric field is applied. Atoms in the crystal lattice move more energetically at elevated temperatures, the drift of the carriers may as a result be reduced because the carriers' increasing interactions with the atoms in the semiconductor. The increased interaction with the atoms by the carriers may result in a reduction in mobility, which may affect the current, $I_D$, in the transistor. The temperature effect on the current may manifest itself in the output voltage. Thus, if the same RF input signal's power is measured at different temperature, different output values may be obtained.

Due to the temperature affecting the output of the circuit, a single-transistor RMS power detector, such as RMS power detector 200, may require multiple calibration steps at different temperatures. Along with the multiple calibration steps, the single-transistor RMS power detector may require testing at multiple temperatures to obtain temperature correction coefficients. The temperature correction coefficients may be used by wireless communication systems, such as wireless communication system 100, to correct power detector measurements obtained at different temperatures. Without the temperature correction coefficients, the power detector measurements may not be correct when the temperature is varying.

The multiple calibration and testing steps may increase production time and production costs. Due to the temperature dependence of the power detection circuit, other methods of implementing the power detector are desired that may eliminate or reduce the effects of temperature and the production costs associated with their testing.

Disclosed herein are systems and apparatuses to improve the temperature effects of a CMOS RF power detector. One embodiment to improve the temperature effects may involve cancelling out the temperature dependent characteristic of a single-transistor input stage of a power detector through the use of multiple feedback loops utilizing operational amplifiers. Another embodiment may involve the use of two transistors in a feedback loop that have comparable physical dimensions of the single-transistor input stage of the power detector. In the later embodiment, due to the physical similarities of the transistors, the current and voltages produced by the transistors upon receiving an RF input signal may be equal except for the DC portion of the RF input signal. By producing comparable voltages in the input stage and the feedback loop and passing them through an operations amplifier, the output of the operational amplifier may produce a voltage that is proportional to the RMS power of the RF input signal. The solution may involve the generation of an output voltage that has the same transfer function as the RF input signal regardless of temperature.

Figure 3:
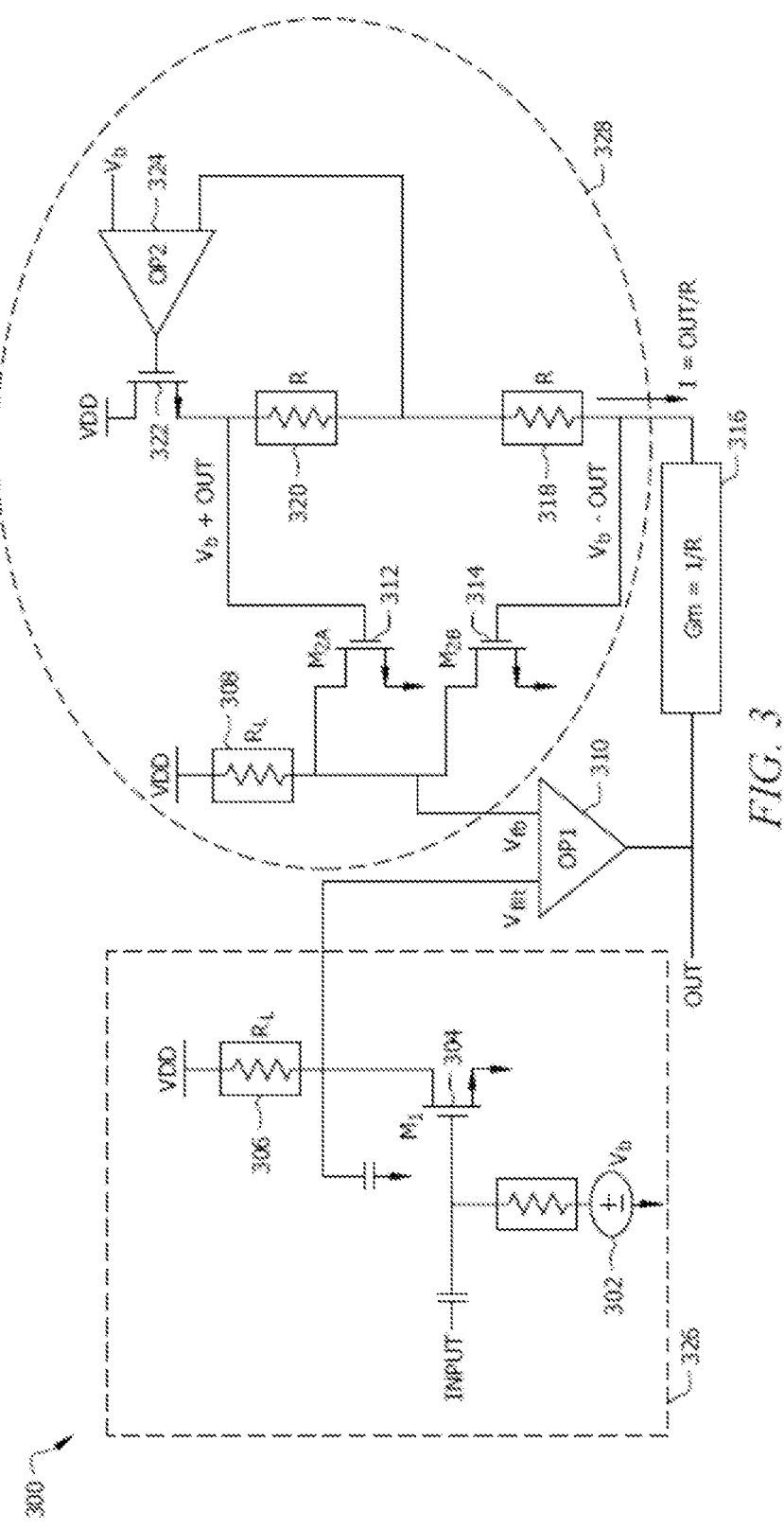
FIG. 3 is a circuit diagram of an embodiment of a temperature independent CMOS RF power detector.

FIG. 3 is a circuit diagram of an embodiment of a temperature independent CMOS RF power detector 300. RF power detector 300 may comprise a first section, or stage, 326, which may be a single-transistor RMS power detector similar to the RMS power detector 200 illustrated in FIG. 2. RF power detector 300 may also comprise a series of feedback loops utilizing operational amplifies, transistors, resistors, and transconductors. RF power detector 300 may comprise two feedback loops and the feedback loops may negate the temperature effects the RMS power detector 200 may tend to suffer. RF power detector 300 comprising the first stage 326 and the two feedback loops may be configured as shown in FIG. 3.

The first section 326 may comprise transistor 304, bias voltage source ($V_b$) 302, and load resistor 306. Similar to the RMS power detector 200, the first section 326 may be the input of the RF power detector 300 by ac-coupling the gate of transistor 304 to an input. The first section 326 may produce a voltage at the drain and may be denoted as $V_{filt}$. $V_{filt}$ may be the input to an operational amplifier, which may be part of one of the two feedback loops of RF power detector 300. $V_{filt}$ may also display the same characteristics of equation 1 shown above for RMS power detector 200.

The two feedback loops in the RF power detector 300, configured as shown in FIG. 3, comprise a first feedback loop associated with operational amplifier OP2 324 and a second feedback loop associated with operational amplifier OP1 310. The first feedback loop, or second section 328, may comprise OP2 324, transistor 322, load resistor 308, transistor 312, transistor 314, resistor 320, and resistor 318. The second feedback loop, or third section, may comprise OP1 310 and the transconductor 316, where the first feedback loop may also be a part of the second feedback loop as configured in FIG. 3. The combination of the two feedback loops may create a feedback network, as configured in FIG. 3, and the feedback network may generate a transfer function from the output of OP1 310 to the input of OP1 310 connected to the feedback network equal to the transfer function for the RF input to $V_{filt}$ generated by the first section 326.

In accordance with various embodiments, OP2 324 of the second section 328 may have one input connected to $V_b$ 302, which may be the same bias voltage source 302 connected to transistor 304 of the first section 326. The other input of OP2 324 may be connected to a nexus point where resistor 320 connects with resistor 318, which may produce a negative feedback loop for OP2 324. The output of OP2 324 may be coupled to the gate of transistor 322. The transistor's 322 drain may be connected to $V_{DD}$ and its source may be connected to resistor 320 on an opposite end as is connected to both resistor 318 and one of the inputs to OP2 324.

The two resistors 318 and 320 may be connected in series with one another such that one end of the pair may be coupled to the source of the transistor 322, the other end of the pair may be coupled to transconductor 316. The nexus point between the two resistors 318 and 320 may be connected to the input of OP2 324, as noted above. The other end of transconductor 316 may be coupled to the output of OP1 310. By connecting resistor 318 and 320 in this configuration, the voltage $V_b$ from $V_b$ 302 may be the voltage obtained at the nexus point between the two resistors as shown in FIG. 3. Assuming OP2 324 is an ideal operational amplifier, OP2 324 will attempt to force its two inputs to be equal causing both inputs to be at a potential equal to $V_b$.

Ideal operational amplifiers configured in a negative feedback loop may be characterized as generating whatever output voltage that may be necessary as to force the two inputs to the operational amplifier to be equal. Thus, taking into account the operation of an ideal operational amplifier, then OP2 324 of FIG. 3 may generate an output voltage at a level needed so that OP2 324's two inputs may be forced to equal one another. Therefore, OP2 324 may generate voltage $V_b$ at the nexus point between the two resistors 318 and 320.

In accordance with various embodiments, OP1 310 of the third section may have one input connected to the first section 326 such that the voltage developed at the drain of transistor 304 is produced on one input of OP1 310. The other input to OP1 310 may be connected in a negative feedback loop configuration through transistor 312, transistor 314, resistor 320, resistor 318, and transconductor 316. The transconductor 316 produces a current from the output voltage of OP1 310 and has a transconductance ($G_m$) of 1/R. The resistance values for resistors 318 and 320 may be equal and they may equal the resistance value used to select the $G_m$ of transconductor 316. Nevertheless, the resistance values of the two resistors 318 and 320 may not need to equal the resistance value used to select the $G_m$ of transconductor 316. The output of OP1 310 may also be the output to RF power detector 300 and may be denoted as OUT for this disclosure.

The load resistor 308 may have a resistance value equal to that of load resistor 306. The load resistor 308 may be coupled between $V_{DD}$ and the drains of transistors 312 and 314. The connection of load resistor 308 and the drains of transistors 312 and 314 may also be connected to the other input of OP1 310. Both the transistor 312 and 314 may have their sources coupled to ground. The gates of transistors 312 and 314 may be coupled to opposite ends of the pair of series-connected resistors 318 and 320. By connecting the gates of transistors 312 and 314 in this manner, they may receive different combinations of $V_b$ and OUT as their gate voltage. The resistors 318 and 320 may be a resistor network configured to produce the different combinations of $V_b$ and OUT shown in FIG. 3. Thus, the transistor 312 may have $V_b$ plus OUT as its gate voltage. Conversely, the transistor 314 may have $V_b$ minus OUT as its gate voltage. However, it does not matter which transistor has which gate voltage so long as one has the two voltages added and the other receives the two voltages subtracted.

The transistors 312 and 314 may also display the same square-law characteristics as displayed by transistor 304. Assuming transistor 304 is similar to transistor 202 in RMS power detector 200, then transistor 304 will have characteristics denoted by carrier mobility, µ, gate oxide capacitance, $C_{ox}$, and a channel of width W and length L. The value K, as defined above, may be $(0.5)*\mu*C_{ox}*(W/L)$. In designing transistors 312 and 314 it may be advantageous to replicate the current and voltage (I-V) characteristics of transistor 304. To replicate transistor 304's I-V characteristics, the physical dimensions of W and L for transistors 312 and 314 may be selected to be equal to those for transistor 304, or a factor of them. Alternatively, the channel width for transistors 312 and 314 may be selected to be half the channel width of transistor 304 while all three transistors may be designed with the same channel length. In accordance with various embodiments, transistors 312 and 314 may be replaced with a single transistor but that may require implementation of a switching and timing circuit so that the gate voltage on the singe transistor could be switched between the two voltages $V_b$+OUT and $V_b$−OUT.

By replicating the characteristics of transistor 304 with the combination of transistors 312 and 314, the temperature dependent factors may be able to cancel each other out so that the output of RF power detector 300 is temperature independent. Since the combination of transistors 312 and 314 may be coupled to the other input of OP1 310, the voltage at that input of OP1 310 will be a voltage produced by the combination of the two transistors 312 and 314. Denoting this voltage as $V_{fb}$, $V_{fb}$ can be defined as:

$$V_{fb} = VDD - [(0.5)*K*(V_b - OUT - V_T)^2 + (0.5)*K*(V_b + OUT - V_T)^2] R_L \quad (2)$$

In equation 2, K may be defined as $(0.5)*\mu*C_{ox}*(W/L)$, where µ may be the carrier mobility, $C_{ox}$ may be the transistor's gate oxide capacitance, W may be the width of the transistor 312's and 314's channel, and L may be the length of the transistor 312's and 314's channel.

The other input to OP1 310 is $V_{filt}$, which is generated by the first stage 326, and can be represented by the following equation:

$$V_{filt} = VDD - [K*(A^2/2) + K*(V_b - V_T)^2] R_L, \quad (3)$$

where K may be defined as $(0.5)*\mu*C_{ox}*(W/L)$, µ may be the carrier mobility, $C_{ox}$ may be the transistor's 304 gate oxide capacitance, W may be the width of the transistor's 304 channel, and L may be the length of the transistor's 304 channel.

Since $V_{filt}$ and $V_{fb}$ are the inputs to OP1 310, which may be configured in a negative feedback loop, then an OUT voltage may be generated to a level that allows OP1 310 to force $V_{fb}$ to equal $V_{filt}$. Assuming OP1 310 is an ideal operational amplifier and that the two inputs may be forced to equal one another, $V_{filt}$ may be set equal to $V_{fb}$. Setting the right sides of equations 2 and 3 equal, solving for OUT may produce $A/\sqrt{2}$, which may be proportional to the RMS power of the input RF signal A sin(ωt).

The RF power detector 300 as configured in FIG. 3 may operate as follows. When an RF signal is generated on the input, the transistor 304 may generate $V_{filt}$ at one input of the OP1 310. As OP1 310 is receiving $V_{filt}$, OP1 310 may begin to change OUT so that $V_{fb}$ may be forced to equal $V_{filt}$. Since OUT may begin to change, transconductor 316, with $G_m$ of 1/R, may begin to produce current I. Current I may be equal to OUT divided by R, which may begin to flow through the resistors 318 and 320. OP2 324 may then produce $V_b$ at the nexus of the two resistors 318 and 320, or $V_b$ may already be established at that nexus point. The voltage combining qualities of the resistors 318 and 320 may then create a voltage at the gates of transistors 312 and 314. The transistor 312 may then have a gate voltage of $V_b$+OUT and the transistor 314 may have a gate voltage of $V_b$−OUT. The gates of the transistors 312 and 314 being biased by their respective gate voltages may then cause current to flow through load resistor 308 so that voltage $V_{fb}$ is generated at an input of OP1 310.

Since OP1 310 may be represented by an ideal operational amplifier configured in a negative feedback loop, it may attempt to change OUT so that $V_{filt}$ and $V_{fb}$ may be forced to become equal. Since $V_{fb}$ and $V_{filt}$ may be represented by equations 2 and 3, respectively, solving for OUT may produce a voltage level that is proportional to the RMS power of the RF input signal.

Additionally, the RMS power voltage produced by a circuit such as RF power detector 300 may be temperature independent. The temperature dependent factors associated with transistors 304, 312, and 314 may cancel each other when $V_{filt}$ representing the first section 326 is set equal to $V_{fb}$, which represents the two feedback loops of RF power detector 300. Even though the temperature dependent factors may still be present in the RF power detector 300, the use of the feedback loops may negate their effect on the output voltage regardless of temperature. Accordingly, by designing transistors 312 and 314 to have a channel width equal to one-half the channel width of transistor 304, the RF power detector 304 may generate an output voltage that is proportional to the RMS power value of an RF input signal. Lastly, implementing the RF power detector 300 of FIG. 3, or a circuit performing substantially the same functions, the testing costs associated with the production of RF power detectors may be reduced.

Figure 4:
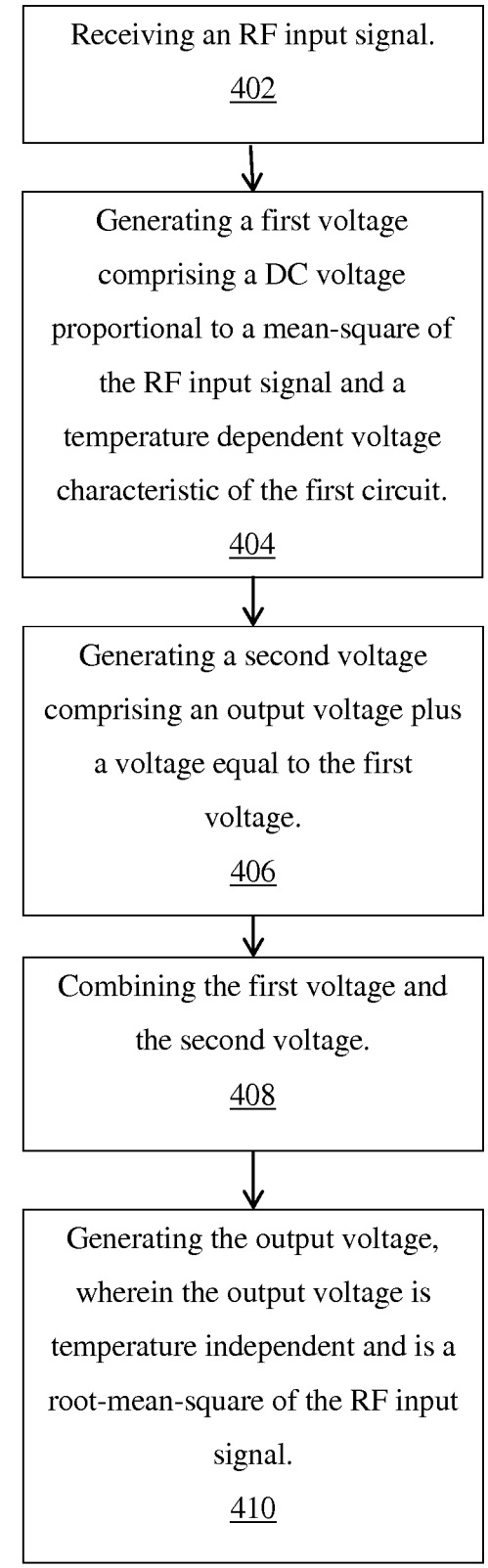
FIG. 4 is a block diagram illustrating an embodiment of a method for generating an RF RMS power detector output that is temperature independent.

FIG. 4 is a block diagram illustrating an embodiment of a method 400 for generating an RF RMS power detector output that is temperature independent, for example that is generated by the temperature independent CMOS RF power detector 300. Method 400 begins in block 402 with receiving an RF input signal. Method 400 continues at block 404 with generating a first voltage comprising a DC voltage proportional to a mean-square of the RF input signal and a temperature dependent voltage characteristic of the first circuit. The voltage generated by block 404 would be similar to the $V_{filt}$ generated by the first section 326 of the temperature independent CMOS RF power detector 300. Method 400 continues at block 406 with generating a second voltage comprising an output voltage plus a voltage equal to the first voltage, such as $V_{fb}$ generated by the second section 328 of the temperature independent CMOS RF power detector 300. Method 400 continues at block 408 with combining the first and second voltages by an operational amplifier configured in a negative feedback loop, such as section 3 of the temperature independent CMOS RF power detector 300. Lastly, Method 400 ends at block 410 with generating the output voltage. The output voltage generated in block 410 may be temperature independent and may be a RMS of the RF input signal. The output voltage may be similar to the output voltage generated by the temperature independent CMOS RF power detector 300.

At least one embodiment is disclosed and variations, combinations, and/or modifications of the embodiment(s) and/or features of the embodiment(s) made by a person having ordinary skill in the art are within the scope of the disclosure. Alternative embodiments that result from combining, integrating, and/or omitting features of the embodiment(s) are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). For example, whenever a numerical range with a lower limit, $R_l$, and an upper limit, $R_u$, is disclosed, any number falling within the range is specifically disclosed. In particular, the following numbers within the range are specifically disclosed: $R=R_l+k*(R_u-R_l)$, wherein k is a variable ranging from 1 percent to 100 percent with a 1 percent increment, i.e., k is 1 percent, 2 percent, 3 percent, 4 percent, 7 percent, . . . , 70 percent, 71 percent, 72 percent, . . . , 97 percent, 96 percent, 97 percent, 98 percent, 99 percent, or 100 percent. Moreover, any numerical range defined by two R numbers as defined in the above is also specifically disclosed. The use of the term "about" means±10% of the subsequent number, unless otherwise stated. Use of the term "optionally" with respect to any element of a claim means that the element is required, or alternatively, the element is not required, both alternatives being within the scope of the claim. Use of broader terms such as comprises, includes, and having should be understood to provide support for narrower terms such as consisting of, consisting essentially of, and comprised substantially of. Accordingly, the scope of protection is not limited by the description set out above but is defined by the claims that follow, that scope including all equivalents of the subject matter of the claims. Each and every claim is incorporated as further disclosure into the specification and the claims are embodiment(s) of the present disclosure. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural, or other details supplementary to the disclosure.

While several embodiments have been provided in the present disclosure, it may be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and may be made without departing from the spirit and scope disclosed herein.

What is claimed is:

1. A power detector circuit, comprising:
   a first section configured to receive a radio frequency (RF) input signal and to generate a first voltage, wherein the first voltage comprises a voltage proportional to the sum of a mean-square of the RF input signal and a voltage characteristic of the first section, and wherein the first voltage is an input to a third section;
   a second section configured to generate a second voltage, wherein the second voltage comprises a combination of an output voltage and a voltage proportional to the voltage characteristic of the first section, wherein the output voltage is proportional to a root-mean-square of the RF input signal; and
   the third section configured to generate the output voltage by combining the first voltage and the second voltage, wherein the second section creates a negative feedback loop for the third section and the output voltage generated by the third section is an output of the power detector circuit.

2. The circuit of claim 1, wherein the first section comprises:
   a first transistor having a gate and a drain, wherein the gate is configured to receive the RF input signal;
   a bias voltage source coupled to the gate of the first transistor; and
   a first resistor coupled to the drain of the first transistor and to a source voltage, and
   wherein the first voltage is generated at the drain of the first transistor.

3. The circuit of claim 1, wherein the second section comprises:
   a resistor network;
   a second transistor having a gate and a drain; and
   a third transistor having a gate and a drain,
   wherein the resistor network is coupled to the gates of the second and third transistors such that a voltage on the gate of the second transistor equals a biasing voltage plus the output voltage and a voltage on the gate of the third transistor equals the biasing voltage minus the output voltage, and wherein the drains of the second and third transistors are coupled to a source voltage through a second resistor and are also coupled to a second input of an operational amplifier.

4. The circuit of claim 3, wherein the resistor network comprises a third resistor and a fourth resistor with equal resistance values.

5. The circuit of claim 1, wherein the third section comprises:
an operational amplifier; and
a transconductor, and
wherein an output of the operational amplifier is coupled to a resistor network through the transconductor.

6. The circuit of claim 1, wherein the first section comprises a first resistor and the second section comprises a second resistor, and wherein the first resistor and the second resistor have equal resistance values.

7. The circuit of claim 1, wherein the first section comprises a first transistor, wherein the second section comprises a second transistor and a third transistor, wherein the first transistor, the second transistor, and the third transistor all have a channel comprising a channel width and a channel length, and wherein the channel width of the second transistor and the channel width of the third transistor are equal to half the channel width of the first transistor.

8. The circuit of claim 7, wherein the channel length of the first transistor, the second transistor, and the third transistor are equal.

9. The circuit of claim 1, wherein the third section comprises an operational amplifier and a transconductor, wherein an output of the operational amplifier is coupled to a resistor network, and wherein a connection from the output of the operational amplifier to the resistor network through the transconductor creates a negative feedback loop.

10. The circuit of claim 1, wherein the output voltage generated by the third section is a temperature independent root-mean-square of the RF input signal.

11. A radio frequency (RF) power detector, comprising:
a first circuit configured to:
receive an input RF signal; and
generate a first voltage which comprises a direct current (DC) voltage proportional to a mean-square of the input RF signal and a voltage characteristic of the operation of the first circuit at an output of the first circuit;
a second circuit configured to generate an output voltage and a voltage equal to the first voltage at an output of the second circuit; and
a first operational amplifier having a first input coupled to the output of the first circuit, a second input coupled to the output of the second circuit, and an output of the first operational amplifier coupled to the second circuit through a transconductor, wherein the output of the first operational amplifier is proportional to the output voltage, which is a root-mean-square of the input RF signal.

12. The RF power detector of claim 11, wherein the output voltage generated by the second circuit is temperature independent.

13. The RF power detector of claim 11, wherein the first circuit comprises:
a first transistor having a gate and a drain, wherein the gate of the first transistor is configured to couple to the input RF signal and a bias voltage source, wherein the drain of the first transistor is configured to couple to a source voltage through a first resistor, wherein the output of the first circuit is generated at the drain of the first transistor, and wherein the first circuit is configured as a RF power detector.

14. The RF power detector of claim 13, wherein the second circuit comprises:
a resistor network in series with the transconductor;
a second transistor having a gate and a drain with its drain coupled to the source voltage through a second resistor and the gate of the second transistor is coupled to the resistor network so that a gate voltage of the second transistor equals the bias voltage plus the output voltage; and
a third transistor having a gate and a drain with its drain coupled to the source voltage through the second resistor and the gate of the third transistor is coupled to the resistor network so that agate voltage of the third transistor equals the bias voltage minus the output voltage.

15. The RF power detector of claim 11, wherein the second circuit comprises a resistor network, a second transistor, and a third transistor, and wherein a connection from the output of the first operational amplifier through the transconductor, the resistor network, and the second and third transistors forms a negative feedback loop.

16. The RF power detector of claim 11, wherein the first circuit comprises a first transistor, wherein the second circuit comprises a second transistor and a third transistor, wherein the operational amplifier's first input is coupled to the drain of the first transistor and the operational amplifier's second input is coupled to the drains of the second and third transistors, and wherein the output voltage of the operational amplifier is a root-mean-square voltage of the RF input signal.

17. The RF power detector of claim 11, wherein the second circuit comprises a resistor network, wherein the resistor network comprises two resistors of equal value connected in series with one end of the resistor network coupled to the transconductor, wherein the other end of the resistor network is coupled to the source of a fourth transistor, and wherein a nexus point between the two resistors is coupled to an input of a second operational amplifier.

18. The RF power detector of claim 11, wherein the second circuit comprises two resistors coupled to the source of a fourth transistor, wherein a nexus point between the two resistors is coupled to an input of a second operational amplifier, and wherein the second operational amplifier is coupled to a bias voltage source through another input and an output of the second operational amplifier is driving a gate of the fourth transistor.

19. The RF power detector of claim 11, wherein the first circuit comprises a first transistor and the second circuit comprises a second transistor and a third transistor, and wherein the first, second and third transistors all have a channel width and a channel length, the channel width of the second and third transistors being half the channel width of the first transistor and the channel length of all three transistors being equal.

20. A method for producing an output voltage of a radio frequency (RF) power detector, comprising:
receiving, by a first circuit, an RF input signal;
generating, by the first circuit, a first voltage comprising a direct current (DC) voltage proportional to a mean-square of the RF input signal and a temperature dependent voltage characteristic of the first circuit;
generating, by a second circuit, a second voltage comprising an output voltage plus a voltage equal to the first voltage;
combining, by an operational amplifier, the first voltage and the second voltage; and generating, by the operational amplifier, the output voltage, wherein the output voltage is temperature independent and is a root-mean-square of the RF input signal.

\* \* \* \* \*

UNITED STATES PATENT AND TRADEMARK OFFICE
CERTIFICATE OF CORRECTION

| | | |
|---|---|---|
| PATENT NO. | : 8,744,379 B1 | Page 1 of 1 |
| APPLICATION NO. | : 13/731815 | |
| DATED | : June 3, 2014 | |
| INVENTOR(S) | : Eric Sung | |

It is certified that error appears in the above-identified patent and that said Letters Patent is hereby corrected as shown below:

In the claims:

Column 12, Lines 4-16, Claim 14, should read as:
"14. The RF power detector of claim 13, wherein the second circuit comprises:
    a resistor network in series with the transconductor;
    a second transistor having a gate and a drain with its drain coupled to the source voltage through
        a second resistor and the gate of the second transistor is coupled to the resistor network so that
        a gate voltage of the second transistor equals the bias voltage plus the output voltage; and
   a third transistor having a gate and a drain with its drain coupled to the source voltage through the
       second resistor and the gate of the third transistor is coupled to the resistor network so that a
       gate voltage of the third transistor equals the bias voltage minus the output voltage."

Signed and Sealed this
Twenty-first Day of October, 2014

Michelle K. Lee
*Deputy Director of the United States Patent and Trademark Office*